United States Patent
Anderson et al.

(10) Patent No.: US 8,184,472 B2
(45) Date of Patent: May 22, 2012

(54) SPLIT-GATE DRAM WITH LATERAL CONTROL-GATE MUGFET

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 12/538,196

(22) Filed: Aug. 10, 2009

(65) Prior Publication Data

US 2010/0232212 A1 Sep. 16, 2010

Related U.S. Application Data

(60) Provisional application No. 61/159,815, filed on Mar. 13, 2009.

(51) Int. Cl.
  *G11C 11/00* (2006.01)
(52) U.S. Cl. .............. 365/149; 365/189.06; 257/296
(58) Field of Classification Search .............. 365/149, 365/189.09; 257/296
  See application file for complete search history.

(56) References Cited

U.S. PATENT DOCUMENTS

| | | | |
|---|---|---|---|
| 6,580,137 B2 | 6/2003 | Parke | |
| 6,888,199 B2 | 5/2005 | Nowak et al. | |
| 6,977,404 B2 | 12/2005 | Katsumata et al. | |
| 6,980,457 B1 | 12/2005 | Horch et al. | |
| 7,037,790 B2 | 5/2006 | Chang et al. | |
| 7,049,654 B2 | 5/2006 | Chang | |
| 7,105,390 B2 | 9/2006 | Brask et al. | |
| 7,120,046 B1 | 10/2006 | Forbes | |
| 7,183,164 B2 | 2/2007 | Haller | |
| 7,193,279 B2 | 3/2007 | Doyle et al. | |
| 7,199,419 B2 | 4/2007 | Haller | |
| 7,208,373 B2 | 4/2007 | Weis | |
| 7,224,020 B2 | 5/2007 | Wang et al. | |
| 7,229,895 B2 | 6/2007 | Wells | |
| 7,241,653 B2 | 7/2007 | Hareland et al. | |
| 7,247,570 B2 | 7/2007 | Thomas | |
| 7,253,493 B2 | 8/2007 | Wang et al. | |
| 7,268,058 B2 | 9/2007 | Chau et al. | |
| 7,279,375 B2 | 10/2007 | Radosavljevic et al. | |
| 7,285,812 B2 | 10/2007 | Tang et al. | |
| 7,348,225 B2 | 3/2008 | Zhu | |
| 7,348,642 B2 | 3/2008 | Nowak | |
| 7,781,283 B2 * | 8/2010 | Anderson et al. | 438/239 |
| 2005/0104130 A1 * | 5/2005 | Nowak et al. | 257/368 |
| 2006/0057787 A1 * | 3/2006 | Doris et al. | 438/153 |
| 2006/0286724 A1 * | 12/2006 | Anderson et al. | 438/149 |
| 2008/0135953 A1 * | 6/2008 | Siprak | 257/411 |
| 2009/0224312 A1 * | 9/2009 | Taketani | 257/330 |
| 2009/0302354 A1 * | 12/2009 | Chuang et al. | 257/206 |
| 2010/0038694 A1 * | 2/2010 | Anderson et al. | 257/303 |

\* cited by examiner

*Primary Examiner* — Hoai V Ho
(74) *Attorney, Agent, or Firm* — David Cain; Roberts Mlotkowski Safran & Cole, P.C.

(57) ABSTRACT

A semiconductor structure of an array of dynamic random access memory cells. The structure includes: a first fin of a first split-gate fin-type field effect transistor (FinFET) device on a substrate; a second fin of a second split-gate fin-type field effect transistor (FinFET) device on the substrate; and a back-gate associated with the first fin and the second fin. The back-gate influences a threshold voltage of the first fin and a threshold voltage of the second fin.

21 Claims, 18 Drawing Sheets

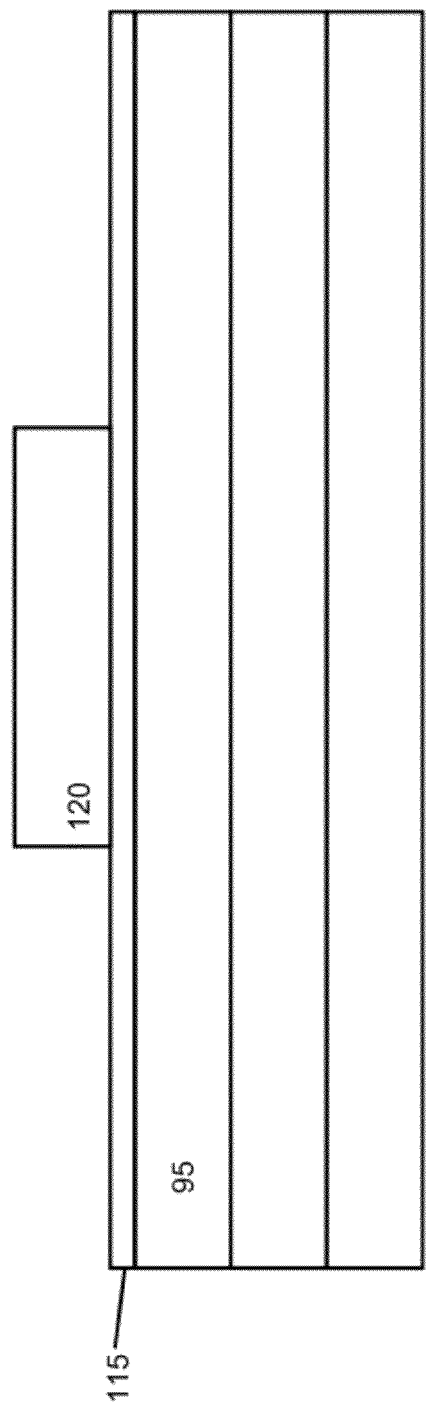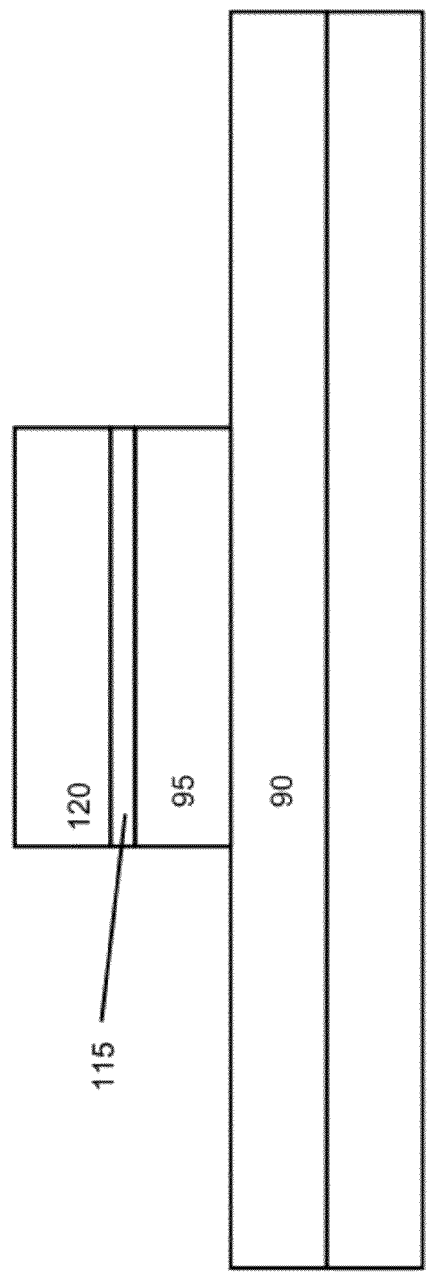

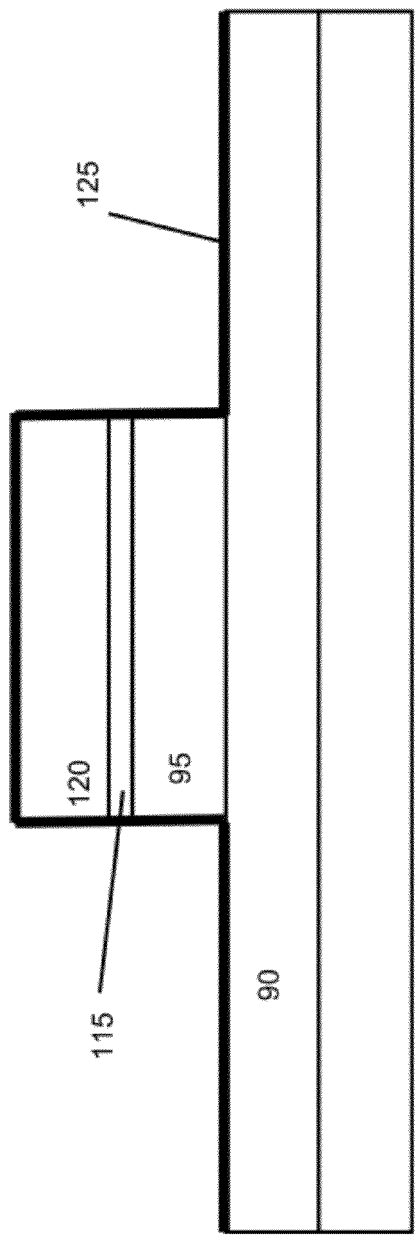
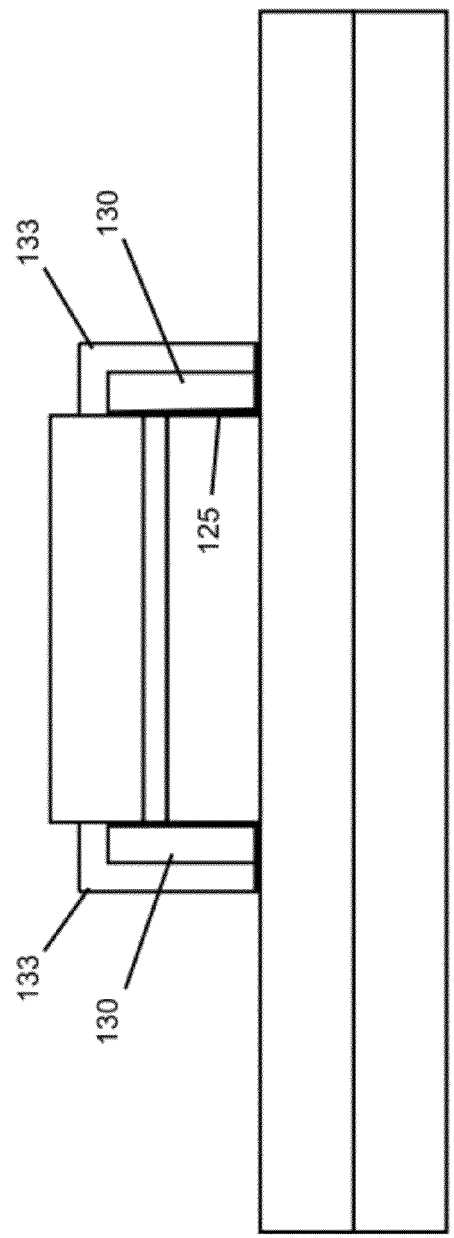

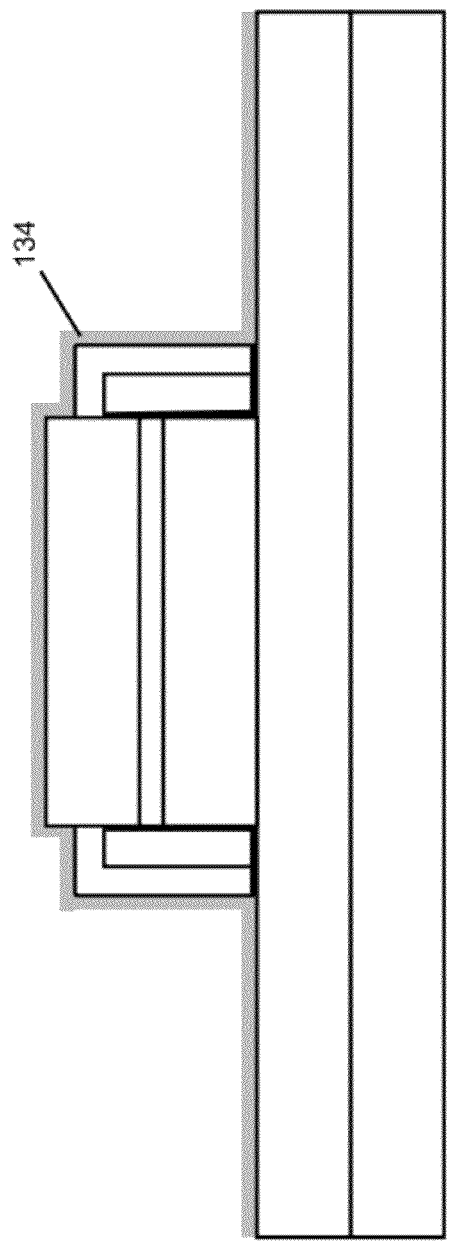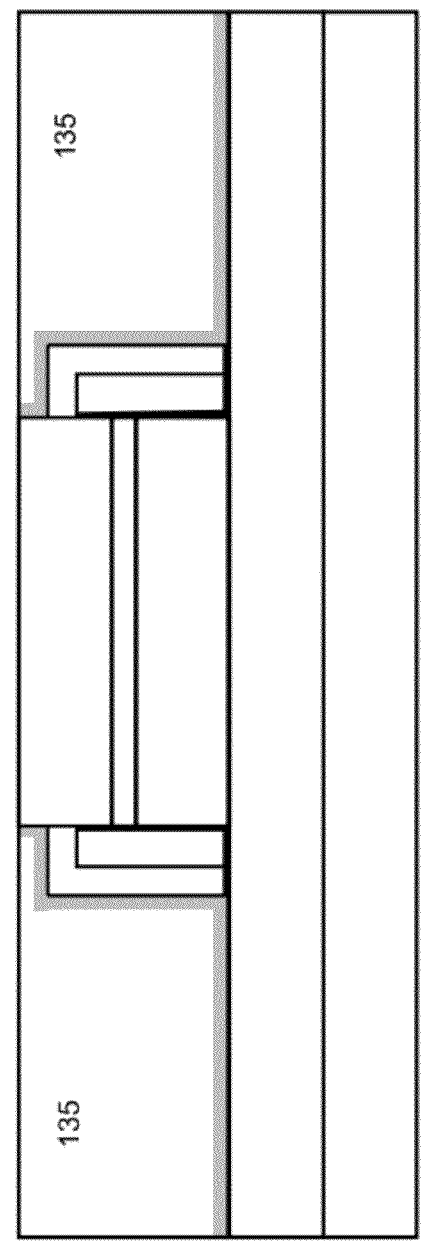

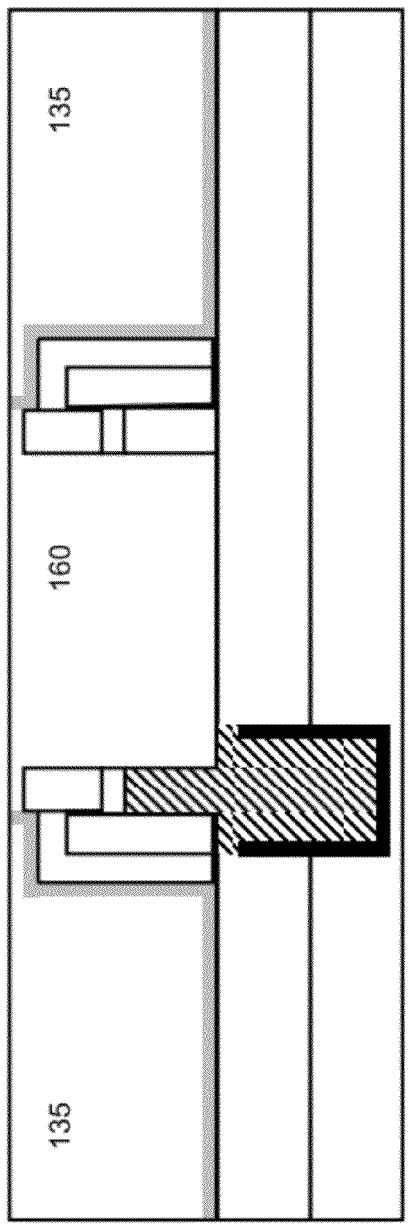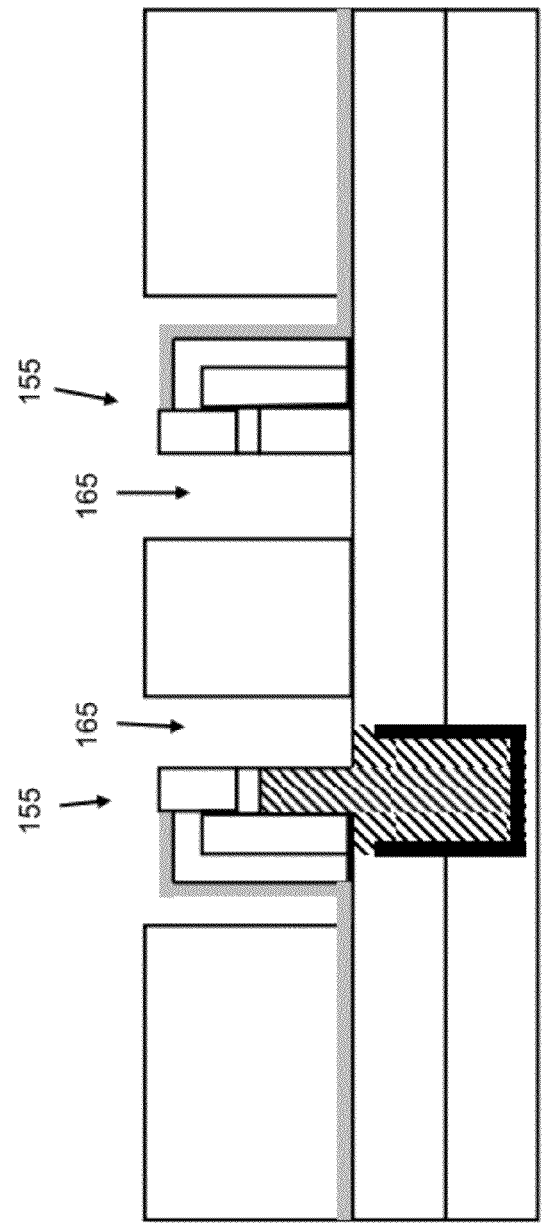

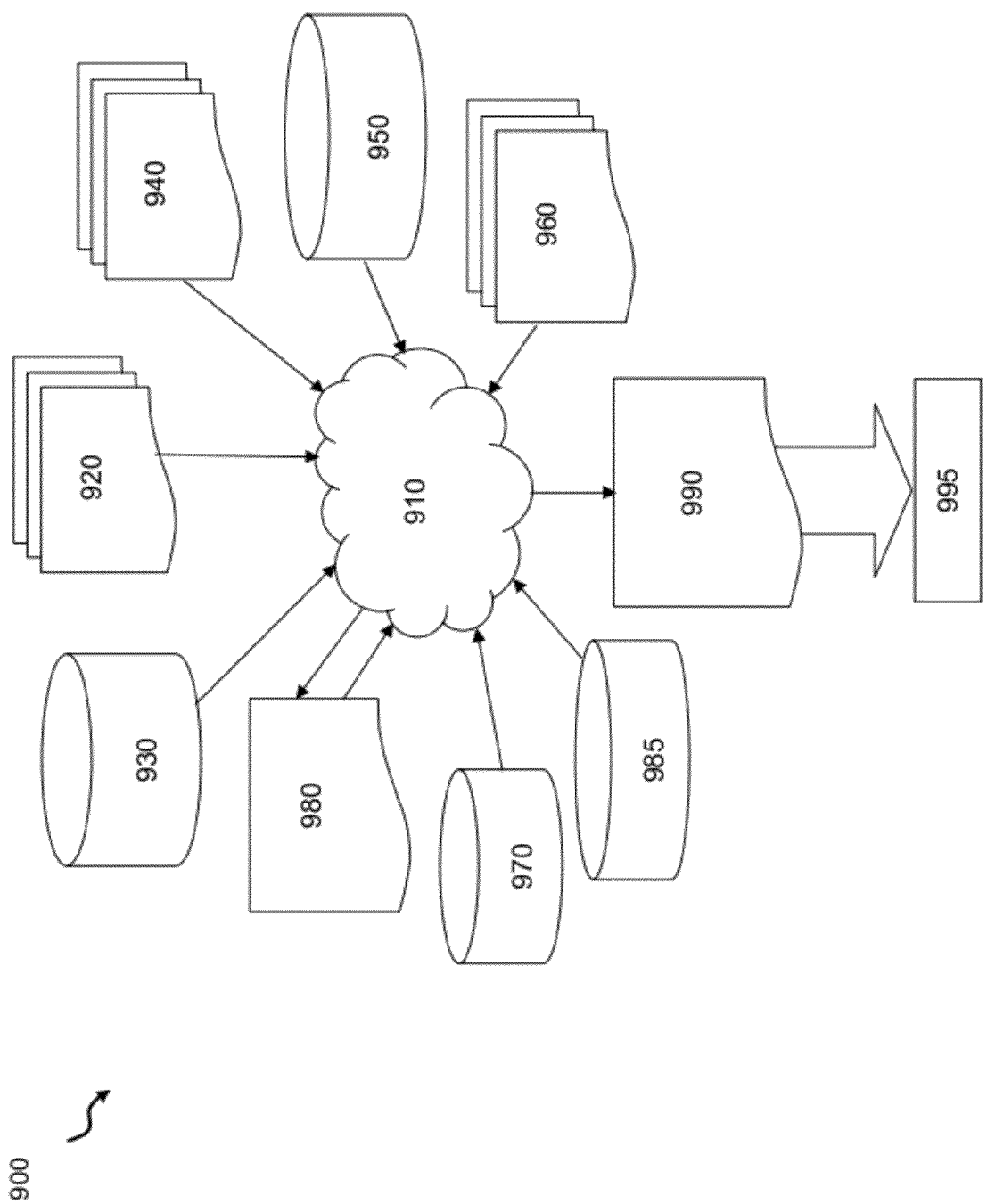

SPLIT-GATE DRAM WITH LATERAL CONTROL-GATE MUGFET

Applicant claims the benefit of Provisional Application Ser. No. 61/159,815, Split-Gate Dram With Lateral Control-Gate Mugfet filed on Mar. 13, 2009.

FIELD OF THE INVENTION

The invention relates to semiconductor devices used for memory applications, and more particularly, to a design structure, structure, and method for providing a split-gate DRAM with MuGFET.

BACKGROUND

DRAM (Dynamic Random Access Memory) is desirable over SRAM (Static Random Access Memory) in many situations because DRAM arrays can be denser and DRAM devices require less power to operate. As semiconductor device sizes continue to decrease (for example, toward the 22 nanometer node, and smaller), single gate devices begin to experience performance degradation, such as short channel effects. Accordingly, there is a trend toward using multiple gate field effect transistor devices (e.g., MuGFET). Some conventional DRAM devices employ a planar transistor with a gate beneath the channel and a word line above the channel. However, these arrangements exhibit relatively low performance and can only be arranged in low-density arrays.

A challenge facing DRAM improvement is the reduction of operating power even lower than what it is currently employed. This is at least partly due to the phenomenon of leakage. For example, when threshold voltage of a fin-type field effect transistor (FinFET) DRAM device is reduced too far, leakage becomes a significant concern. The threshold voltage of FinFET retards leakage of stored charge out of the capacitance structure of the DRAM. Leakage increases as threshold voltage decreases, thereby requiring more frequent updating of the capacitance structure of the DRAM.

However, it is desirable in some circumstances to have a low threshold voltage, because a lower threshold voltage permits a lower wordline voltage to be utilized with the DRAM device. Put another way, when the threshold voltage is kept high to prevent undesirable leakage, the wordline voltage during write and read operations must also be high to overcome the threshold voltage. Since the wordline voltage is directly related to the operating power required to drive a DRAM device, leakage is generally in conflict with lowering the operating power.

Accordingly, there exists a need in the art to overcome the deficiencies and limitations described hereinabove.

SUMMARY

In a first aspect of the invention, there is a semiconductor structure of an array of dynamic random access memory cells. The structure comprises: a first fin of a first split-gate fin-type field effect transistor (FinFET) device on a substrate; a second fin of a second split-gate fin-type field effect transistor (FinFET) device on the substrate; and a back-gate associated with the first fin and the second fin. The back-gate influences a threshold voltage of the first fin and a threshold voltage of the second fin. One embodiment of the invention combines the first fin with a first storage capacitor, and combines the second fin with a second storage capacitor.

In a second aspect of the invention, there is a design structure tangibly embodied in a machine readable medium for designing, manufacturing, or testing an integrated circuit. The design structure comprises a semiconductor structure as described above.

In a third aspect of the invention, there is a method of controlling an array of dynamic random access memory cells, comprising: arranging a back-gate in association with a first plurality of split-gate fin-type field effect transistor (FinFET) devices in the array; and selectively influencing a voltage in a fin of each of the plurality of FinFET devices between a first threshold voltage and a second threshold voltage using the back-gate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 2-20 show fabrication processes and respective structures for manufacturing a structure in accordance with aspects of the invention;

FIG. 28 is a flow diagram of a design process used in semiconductor design, manufacture, and/or test.

DETAILED DESCRIPTION

The invention relates to semiconductor devices used for memory applications, and more particularly, to a design structure, structure, and method for providing a split-gate DRAM with MuGFET. In embodiments of the invention, a DRAM device comprises a FinFET having a wordline on a first lateral side of a vertical fin and a back-gate on an opposite lateral side of the fin. According to aspects of the invention, a single back gate is associated with plural memory cells. For example, a single back gate may be arranged adjacent to plural fins of at least two neighboring memory cells. In this manner, the threshold voltage of the fin of each of the memory cells may be controlled by controlling the electrical potential of the single back gate.

In embodiments of the invention, the DRAM device operates in at least two modes. In a first mode (e.g., standby mode), the back-gate is biased relatively negative (e.g., to about −1.0 v), which results in a high threshold voltage in all fins associated with the back-gate, which reduces subthreshold channel leakage. In a second mode of operation (e.g., read/write mode, also referred to as access mode), the back-gate is biased to a relatively positive level (e.g., about 0 to +1.0 v), which lowers the threshold voltage in all of the fins associated with the back-gate, which reduces the amount of voltage required on the wordline to read from or write to the storage structure (e.g., capacitor) of the DRAM, and hence reduces the required power for a read or a write operation. In this manner, plural devices can be placed in standby mode or access mode at the same time using a single back gate. When the plural devices are placed in access mode, respective ones of the devices may be accessed by applying an appropriate voltage to the respective word-lines.

In this manner, embodiments of the invention include a DRAM device that operates at relatively low power while reducing the effect of leakage. Moreover, by using a vertical fin and split gates with a single back-gate arranged to control multiple devices, implementations of the invention provide this low-power DRAM device in dense arrays.

Figure 1:
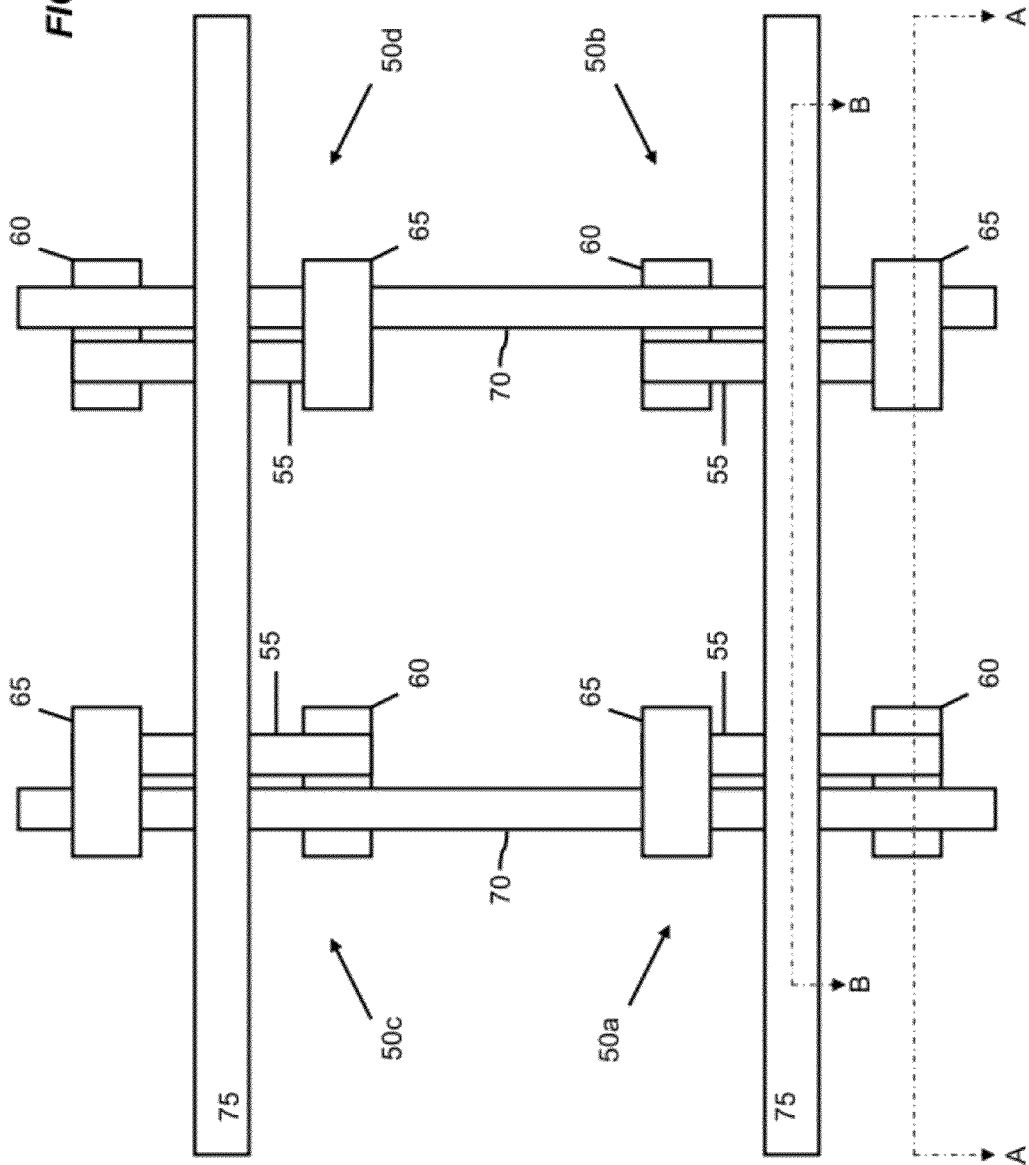
FIG. 1 shows a cross-sectional plan view of portions of an interleaved array of DRAM devices according to aspects of the invention.

FIG. 1 shows a cross-sectional plan view of portions of an interleaved array of DRAM devices according to aspects of the invention. Each respective device 50a-d is a FinFET device comprising a fin 55, storage capacitor 60, and bit line contact 65. In embodiments, back-gates 70 and word lines 75 are arranged laterally to the sides of the fins 55. In embodiments a single back gate 70 is associated with and arranged to control at least two devices (e.g., 50a and 50c). According to aspects of the invention, the back gate 70 continues in a substantially linear fashion across two (or more) devices (e.g., 50a and 50c). In embodiments, the array is interleaved such that the storage capacitor 60 of one device (e.g., 50a) is in the place of the bit line contact 65 of an adjacent device (e.g., 50b), and vice versa.

Figure 2:
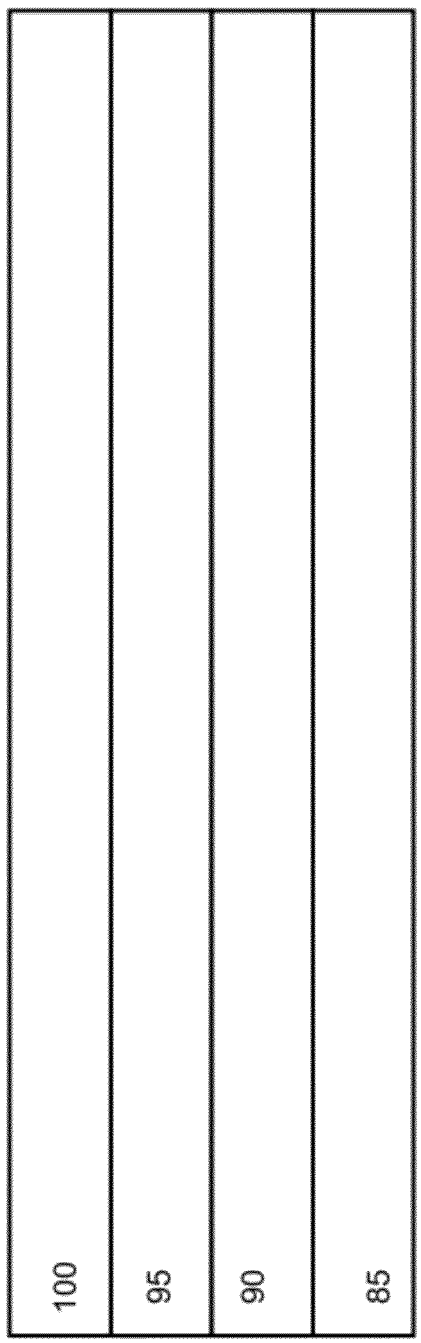

FIGS. 2-20 show fabrication processes and respective structures for manufacturing a structure in accordance with the present invention. FIG. 2 shows a beginning structure for forming devices according to aspects of the invention. As depicted in FIG. 2, a doped region 85 is formed as a doped region within a substrate (not shown). The doped region 85 may be either an N-type region or a P-type region, depending upon the desired intended use of the semiconductor structure. Formed on a top surface of the doped region 85 is an insulator 90, such as a buried oxide (BOX). Formed on a top surface of the BOX 90 is an active silicon region 95. Formed on a top surface of the active silicon 95 are pad films 100, which may comprise, for example, an $SiO_2$ layer formed on the active silicon 95 and an $Si_3N_4$ layer formed on the $SiO_2$ layer. All of the layers described thus far (e.g., 85, 90, 95, 100) may be formed using conventional semiconductor processing techniques.

Figure 3:
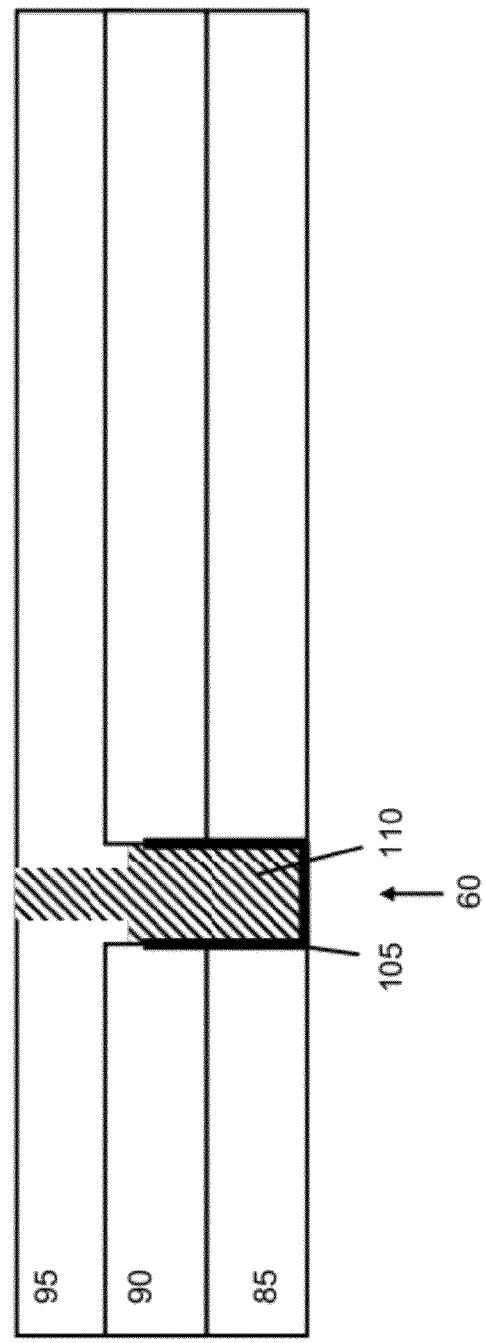
Figure 10:
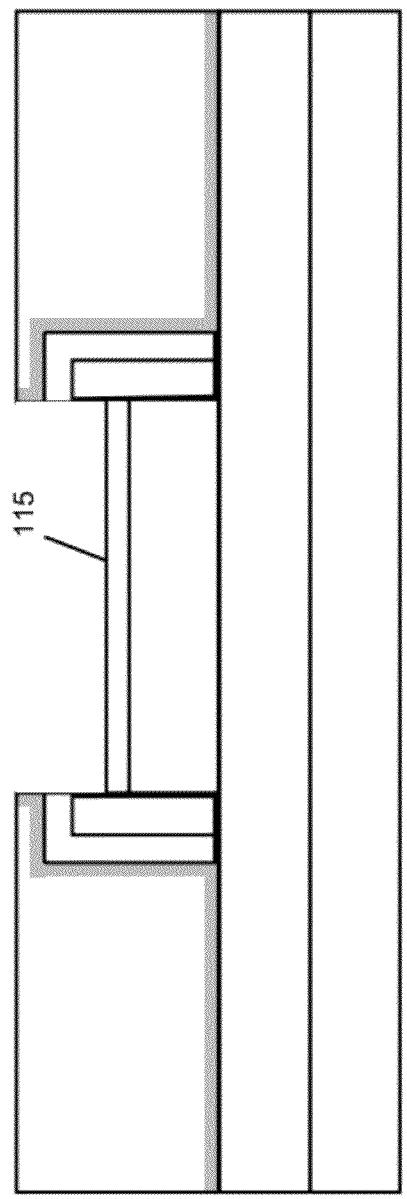
Figure 11:
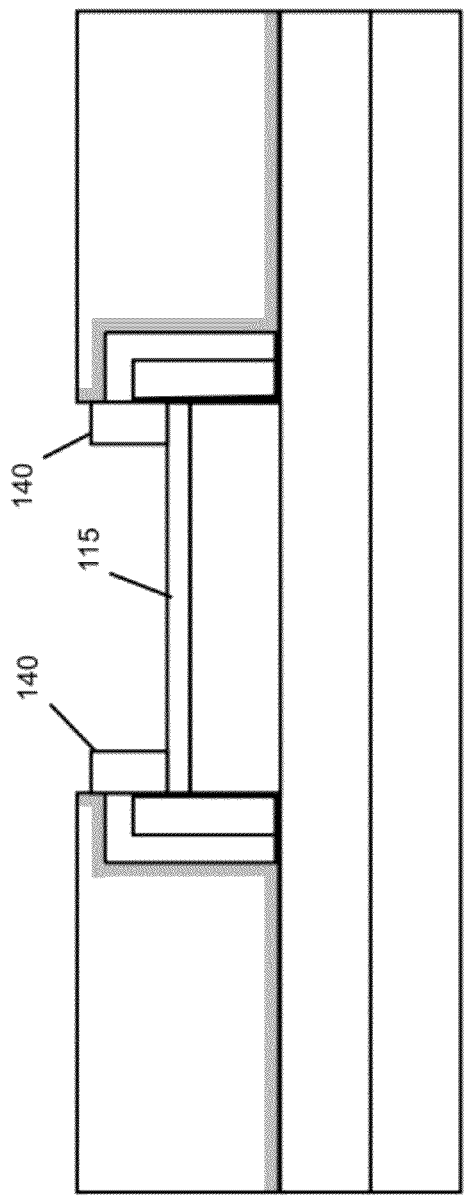
Figure 12:
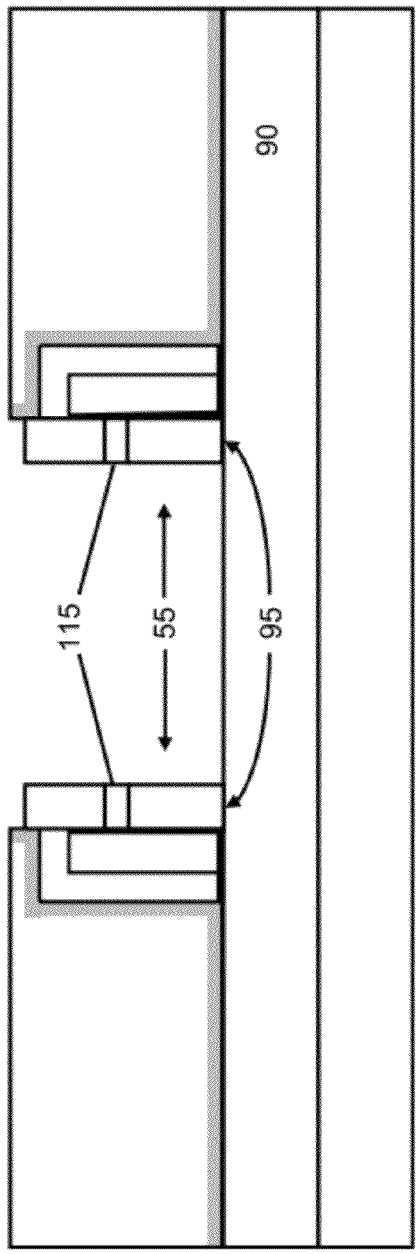

FIG. 3 shows the structure of FIG. 2 after a number of intermediate processing steps, and corresponds to a cross section along line A-A of FIG. 1. As depicted in FIG. 3, capacitor 60 has been formed in the layers 85, 90, and 95. A trench capacitor dielectric 105 surrounds a trench conductor 110 in the capacitor 60. The trench capacitor dielectric 105 may be composed of, for example, an oxynitride, high-k dielectric, etc. In embodiments, when the trench capacitor dielectric 105 is an oxynitride, the trench conductor 110 may be formed of doped polysilicon. Alternatively, when the trench capacitor dielectric 105 is a high-k dielectric, the trench conductor 110 may be formed of a titanium nitride liner surrounding aluminum or doped polysilicon. However, the invention is not limited to these materials, and any suitable materials may be used for the trench capacitor dielectric 105 and the trench conductor 110.

The intermediate process steps for forming the structure of FIG. 3 may include, for example: forming a trench in the pad films 100 (e.g., using conventional patterning and etching, such as photolithography and reactive ion etching (RIE)), forming a corresponding trench in the layers 85, 90, and 95 (e.g., using RIE); depositing the trench capacitor dielectric 105 (e.g., using chemical vapor deposition (CVD), atomic layer deposition (ALD), etc.); form filling the trench conductor 110; planarizing the top surface of the structure (e.g., using chemical mechanical polish (CMP); etching the trench conductor 110 down to a level within the BOX layer 90 (e.g., below the active silicon 95); etching back the pad films away from the trench; removing any trench dielectric exposed by the etching of the trench conductor 110 (e.g., using wet etch, isotropic etch, etc.); growing, optionally selectively, silicon to fill in open portions of the trench between the trench conductor 110 and the active silicon 95; and stripping the remaining pad films 100 (e.g., using selective RIE, then a wet or dry etch).

FIGS. 4-13 show intermediate structures shown along line B-B of FIG. 1 during manufacturing steps according to aspects of the invention. In embodiments, the processing steps shown in FIGS. 4-13 occur after the capacitor 60 has been formed, as depicted in FIG. 3. As depicted in FIG. 4, a second pad film 115 is formed on a top surface of the active silicon 95, and a mandrel 120 is formed on a top surface of the second pad film 115. The second pad film 115 and mandrel 120 may be any suitable materials, and may be formed using conventional deposition techniques. The pad film may comprise, for example, oxide, nitride, or a combination of the both. The mandrel may be composed of, but is not limited to, silicon dioxide, or a polyimide.

As depicted in FIG. 5, portions of the second pad film 115 and active silicon 95 are etched to expose portions of the BOX 90. The etching may be performed using conventional etching techniques, such as photolithographic masking and RIE. As depicted in FIG. 6, back-gate dielectric 125 is formed on all exposed surfaces (e.g., of layers 90, 95, 115 and 120). The back-gate dielectric 125 may be composed of any suitable substance, including, but not limited to, hafnium oxide, hafnium silicate, etc. The back-gate dielectric 125 may be formed by known techniques (e.g., deposition, thermal oxidation, etc.).

As depicted in FIG. 7, back-gate electrode material 130 is conformally deposited and anisotropically etched to form sidewall gates. Also, a gate cap layer 133 is formed around the gate stacks of back-gate electrode material 130. In embodiments, the back-gate electrode material 130 comprises, but it not limited to, a titanium nitride and tungsten composite. In embodiments, gate cap layer 133 comprises, but it not limited to, dielectric material, such as, for example nitride or oxynitride. Subsequently, exposed back-gate dielectric 125 is removed via etching.

As depicted in FIG. 8, a side gate dielectric isolation layer 134 is formed on exposed surfaces. In embodiments, the side gate dielectric isolation layer 134 may comprise $Si_3N_4$ and may be formed using conventional insulator deposition techniques, such as conformal desposition. However, the invention is not limited to $Si_3N_4$, but rather, any suitable material may be used.

As depicted in FIG. 9, an insulator 135 (e.g., $SiO_2$) is formed above the sidewall gates adjacent the mandrels 120. Surfaces may be planarized between steps. At FIG. 10, the mandrel is removed to expose portions of the second pad film 115. The mandrel may be removed using RIE. At FIG. 11, spacers 140 are formed on the second pad film 115. The spacers 140 may be nitride, for example, formed using a conformal nitride deposition followed by a directional etch. At FIG. 12, portions of the pad film 115 and active silicon 95 are removed to form the fins 55. For example, a first hard mask etch may be followed by a second silicon etch that removes any exposed silicon down to the BOX layer 90.

Figure 13:
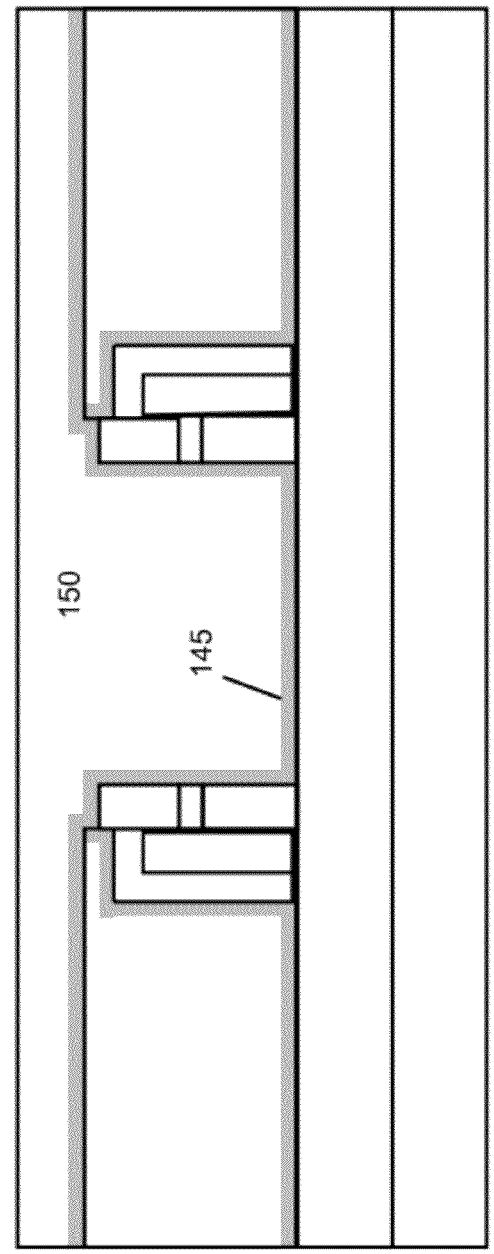

As depicted in FIG. 13, a word-line gate dielectric 145 is formed on exposed surfaces and a word-line gate electrode material 150 is formed on the word-line gate dielectric 145. In embodiments, the word-line gate dielectric 145 includes hafnium oxide, hafnium silicate, etc., although any suitable material may be used. In embodiments, the word-line gate electrode material 150 is composed of any suitable conductor, including, but not limited to: titanium nitride, tungsten, doped polysilicon, etc.

Figure 14:
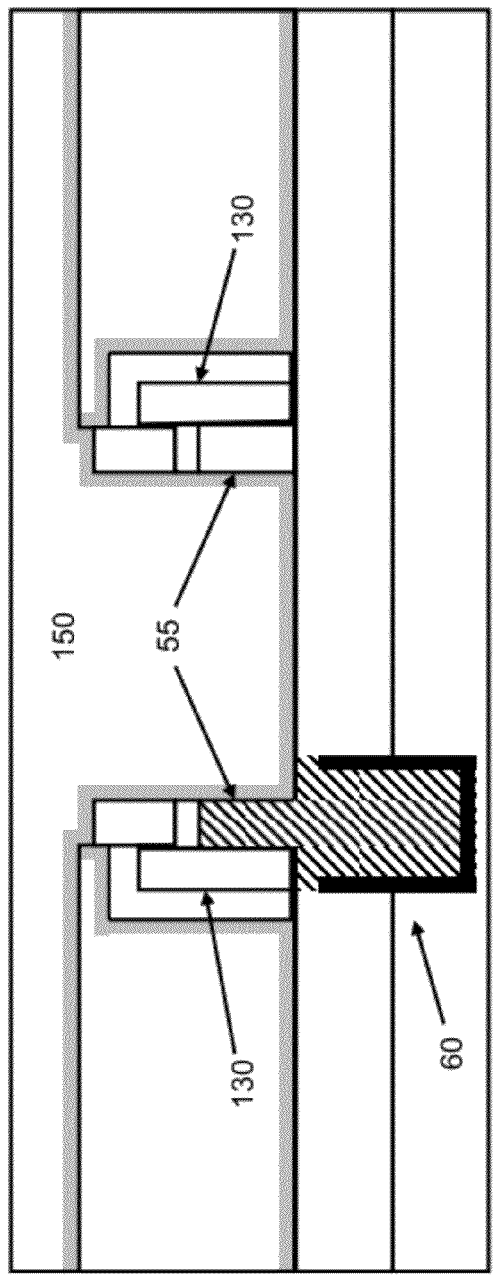

FIG. 14 shows a cross section of an intermediate structure along line A-A following the processing steps described above with respect to FIGS. 2-13 but prior to patterning and etching of the word-line. For example, the processing steps described above with respect to FIGS. 4-13 result in the formation of, among other things, back-gate electrode material 130 and word-line gate electrode material 150 on opposite side of fins 55 in the vicinity of the capacitor 60 and where the bit line contact will later be formed (e.g., along line A-A of FIG. 1).

Figure 15:
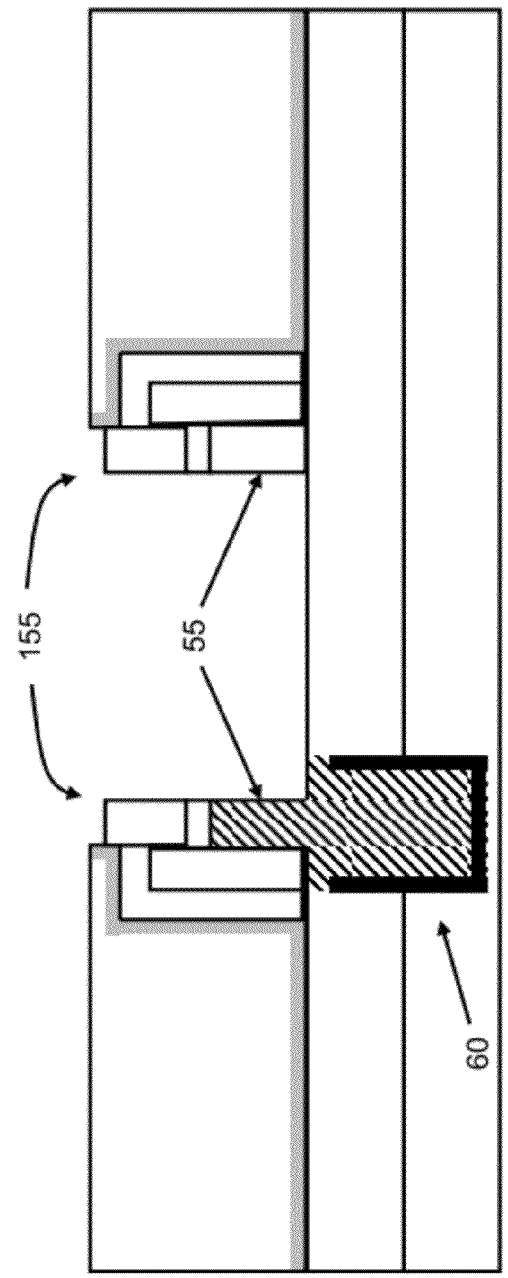

FIG. 15 shows a cross section of an intermediate structure along line A-A after patterning and etching of the word-line. In embodiments, the word line patterning and etching comprises conventional masking and etching techniques performed for the selective removal of the word-line gate dielectric and word-line gate electrode material from predetermined areas of the array (e.g., in the vicinity of line A-A), such that a word line is formed on a side of each fin 55 opposite the back gate 70 (e.g., in the vicinity of line B-B), as depicted in FIG. 1. Moreover, as depicted in FIG. 15, the word line patterning and etching exposes contacts 155 for the capacitor 60 and a bit line contact (such as 65 shown in FIG. 1, not yet formed in FIG. 15). After the word-line patterning and etching, the portions of the fins 55 that will serve as the source and drain for each respective FinFET device may be doped using conventional techniques, such as masking and ion-implantation of suitable ions.

FIGS. 16-20 depict processing steps and cross sections of intermediate structures along line A-A of FIG. 1, after word line patterning and etching as described above with respect to FIGS. 14 and 15, according to aspects of the invention. At FIG. 16, the opening between the fins is filled with an insulator material 160. In embodiments, the insulator material 160 may be the same as insulator 135 (e.g., $SiO_2$), and may be formed using conventional methods. Then, as depicted at FIG. 17, a patterned etch is performed to produce trenches 165 around the contacts 155.

Figure 18:
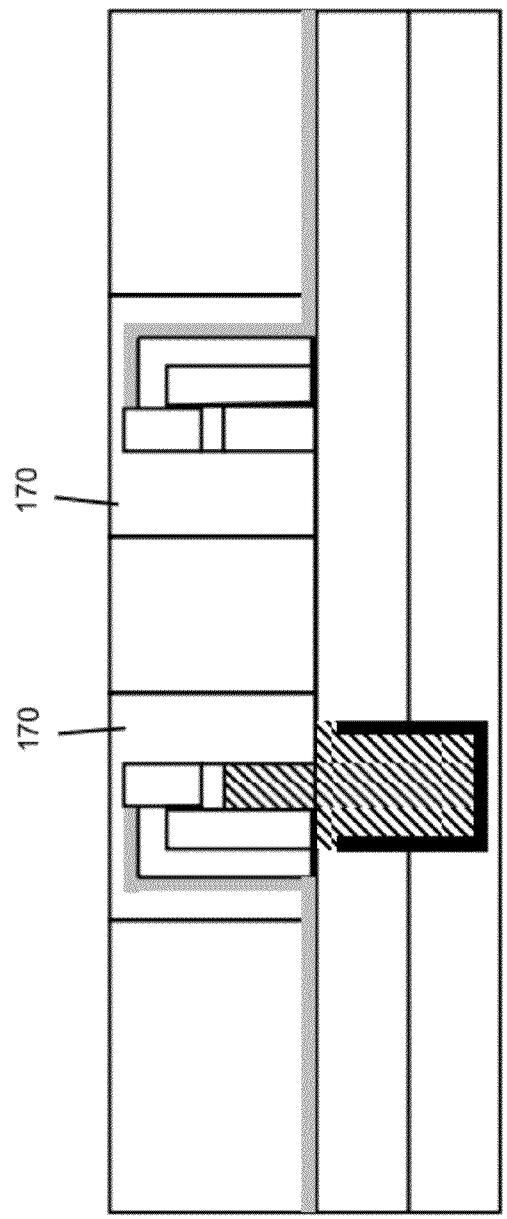
Figure 19:
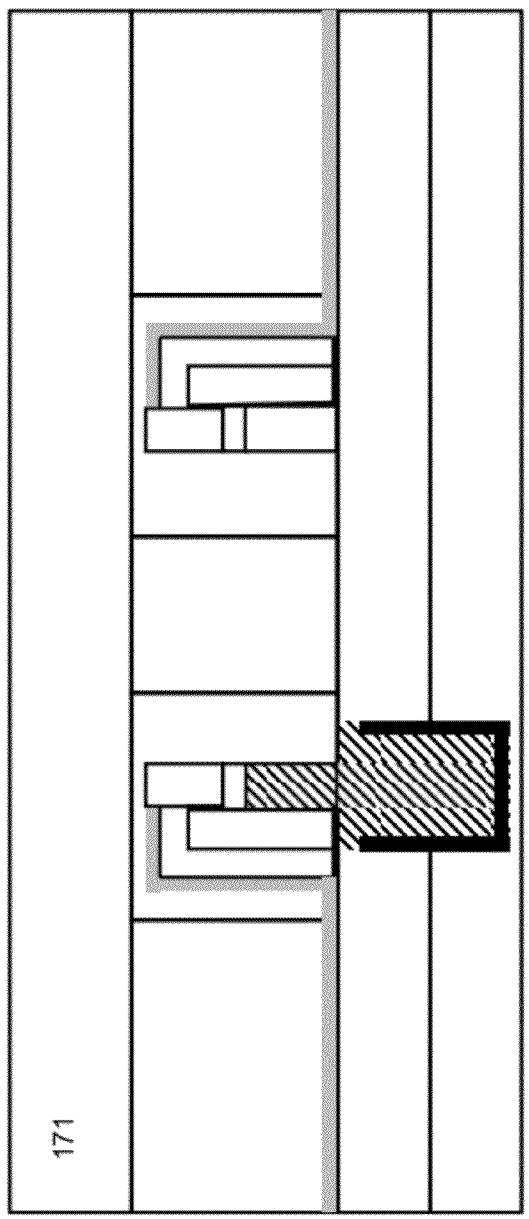
Figure 20:
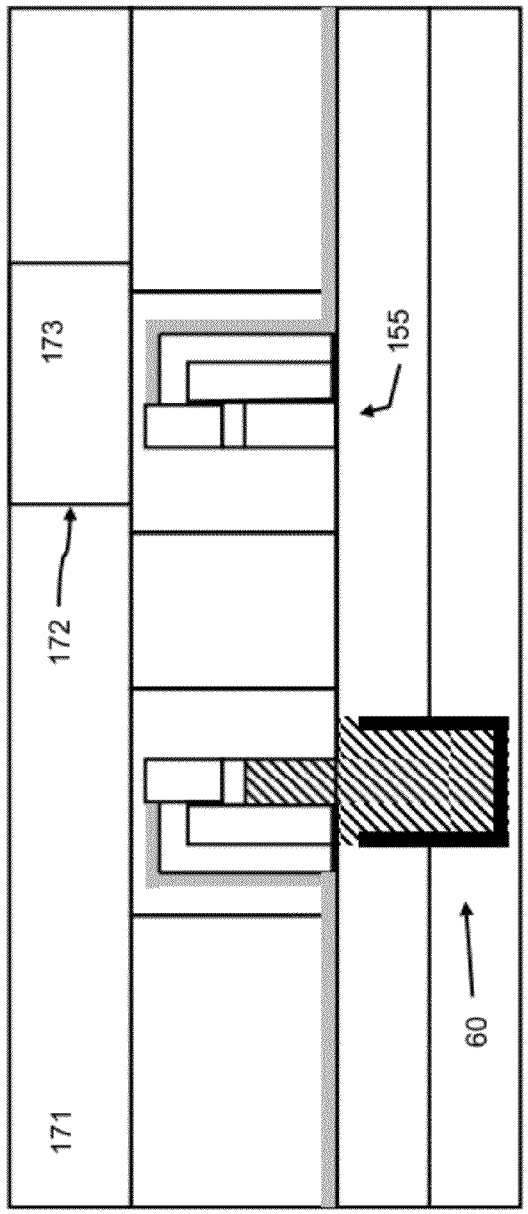

At FIG. 18, the trenches are filled with a conductor 170, such as, for example, doped polysilicon, copper, tungsten, etc. As depicted at FIG. 19, a layer of insulator material 171 (e.g., $SiO_2$) is formed over exposed surfaces. Then, as shown in FIG. 20, a trench 172 is formed in the layer of insulator material 171 over contacts 155 not associated with a capacitor 60. Still referring to FIG. 20, the trench 172 is filled with a conductor 173 (such as, for example, copper, tungsten, etc.), thereby forming a bit line contact 65 (such as that shown in FIG. 1). At this point, conventional back end of line (BEOL) processing techniques may be used to finish the array. For example, conventional interconnect processes may be used to providing wiring that completes the array.

In embodiments, the manufacturing steps described with respect to FIGS. 2-20 may be used to create an array of dynamic random access memory cells, such as that shown in FIG. 1. For example, although the semiconductor structures shown in FIGS. 2-20 are cross sections along lines A-A and B-B (e.g., devices 50a and 50b in FIG. 1), it is understood that in embodiments of the invention similar processing steps may be concurrently performed to create any desired number of devices in an array (e.g., 50c and 50d in FIG. 1). In this manner, a single back-gate formed using the processing steps of FIGS. 2-20 may be formed in association with a plurality of devices in an array. Moreover, although an array having two back gates and four devices has been described thusfar, the invention is not limited to this number of devices, and any suitable number of devices can be used in an array in accordance with aspects of the invention.

Figure 21:
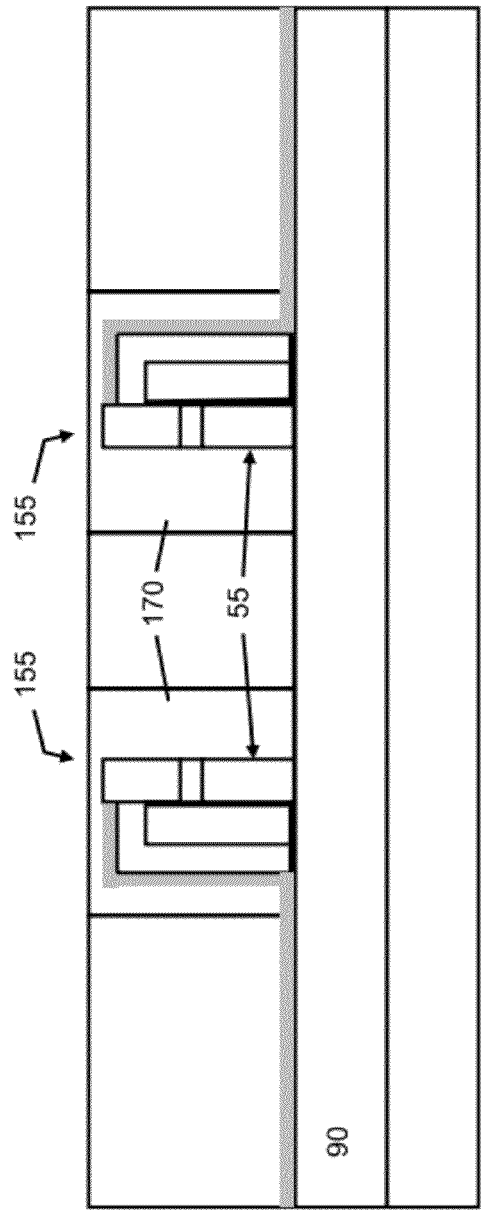
FIGS. 21-26 show fabrication processes and respective structures for manufacturing a structure in accordance with aspects of the invention.

FIGS. 21-27 show fabrication processes and intermediate structures for forming an interleaved array of DRAM memory devices in accordance with the invention, such as, for example, that shown in FIG. 1. However, in the devices shown in FIGS. 21-27, the capacitor is formed over the fin, instead of under the fin (as in FIGS. 3-20). The structure shown in FIG. 21 may be arrived at using the same processing steps as described above with respect to FIGS. 2-18, excluding the formation of the capacitors described with respect to FIG. 3. Accordingly, FIG. 21 shows a number of contacts 155 formed on a top surface of the BOX layer 90, for example, at the line A-A of FIG. 1. Each contact 155 comprises a portion of a fin 55 associated with a respective back-gate 70, and in electrical contact with conductor 170.

Figure 22:
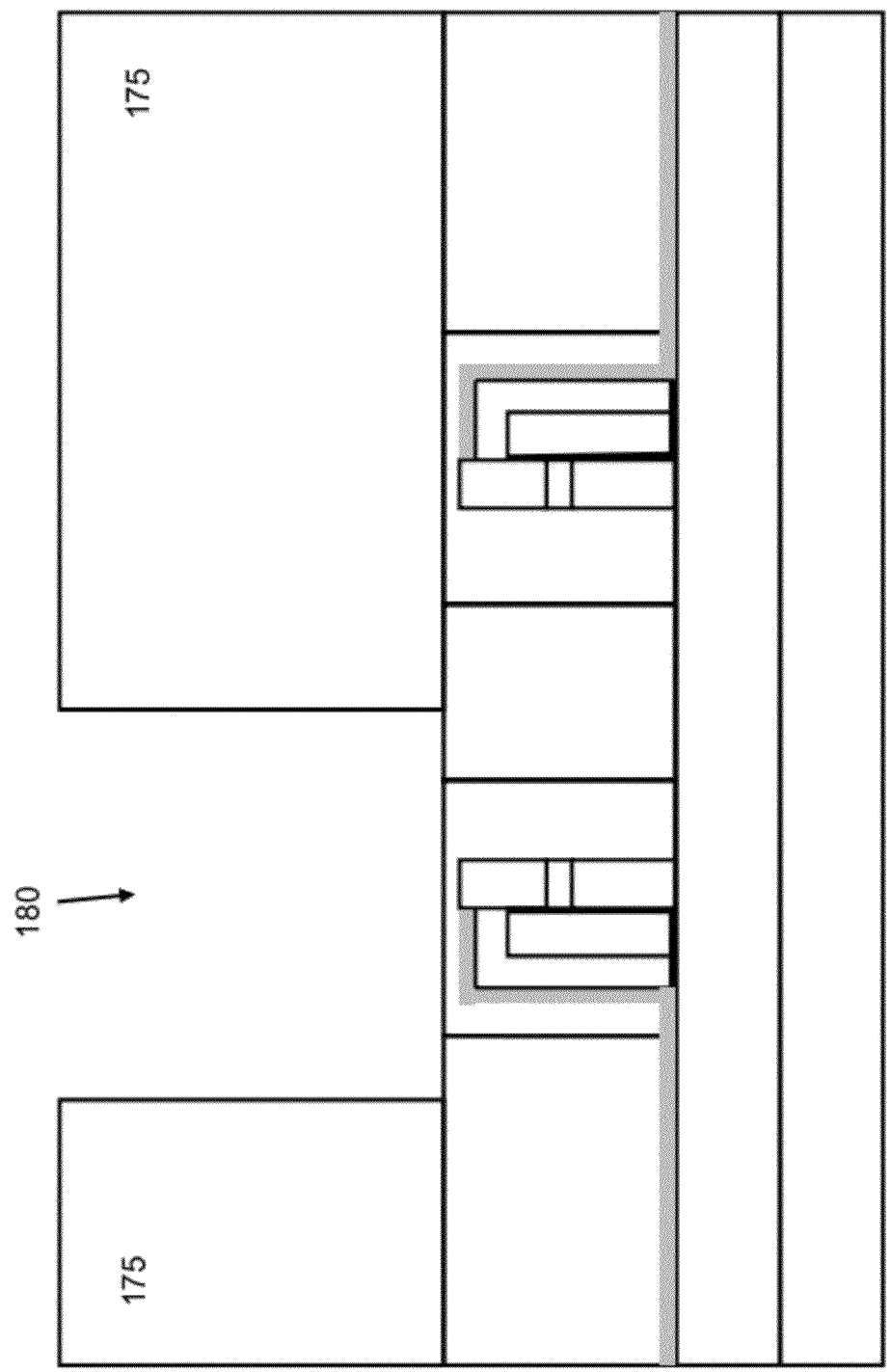

As depicted in FIG. 22, a second layer of dielectric material 175 is deposited on exposed surfaces (e.g., the insulator materials, and the conductor). The second layer of dielectric material 175 may comprise any suitable material, such as, for example, $SiO_2$. Trenches 180, which will hold the storage capacitors (not yet formed), are created in the second layer of dielectric material 175, using, for example, conventional patterning and etching techniques.

Figure 23:
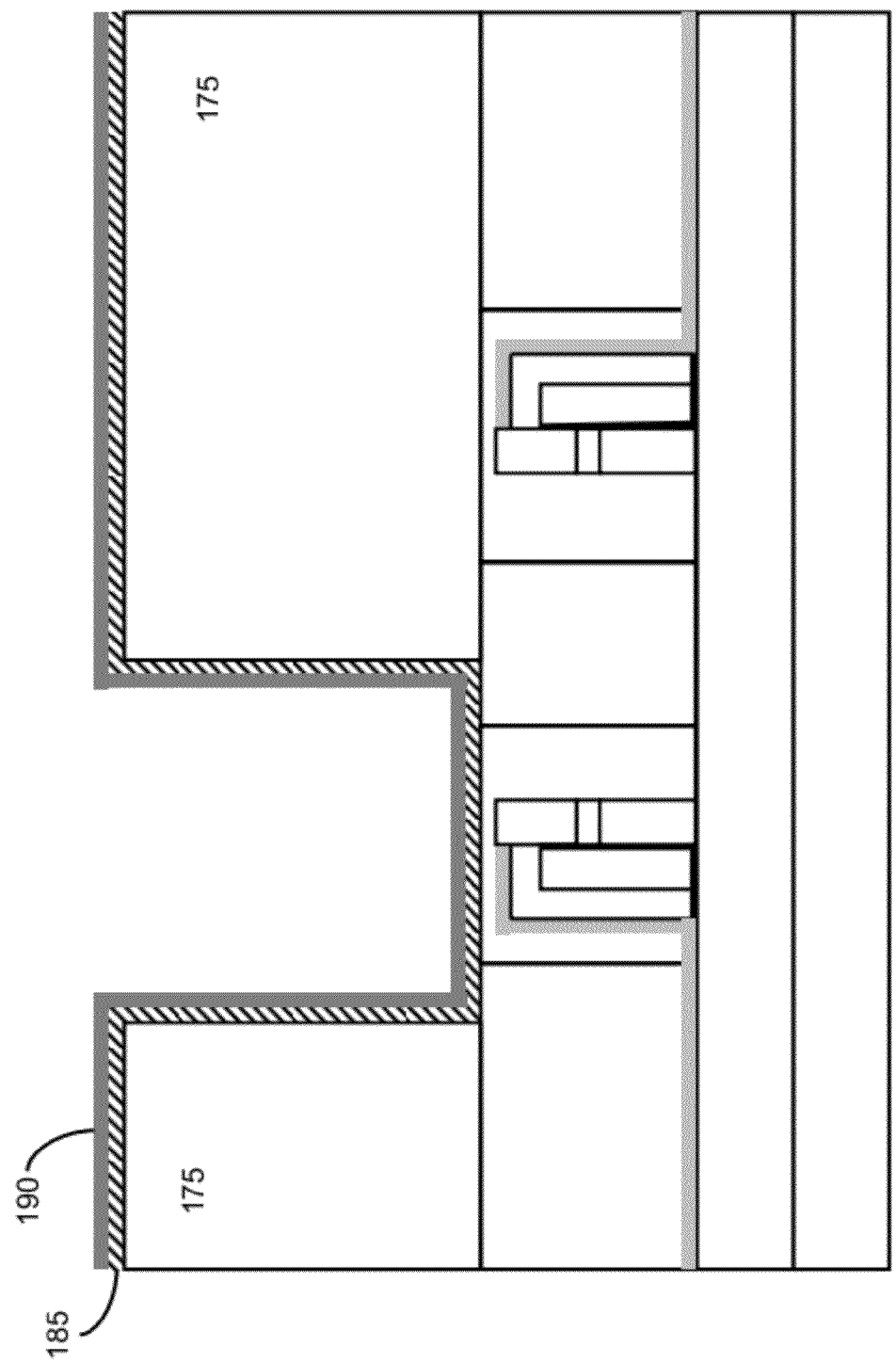

As depicted in FIG. 23, a conductive liner 185 is conformally deposited on the exposed surfaces of the second layer of dielectric material 175, including inside the trenches 180. The conductive liner 185 may be composed of, but is not limited to, titanium nitride, tantalum nitride, etc. Subsequently, a storage dielectric material 190 is deposited on the conductive liner 185. In embodiments, the storage dielectric material 190 is composed of high-k dielectric, such as hafnium silicate, although other suitable materials may be used.

Figure 24:
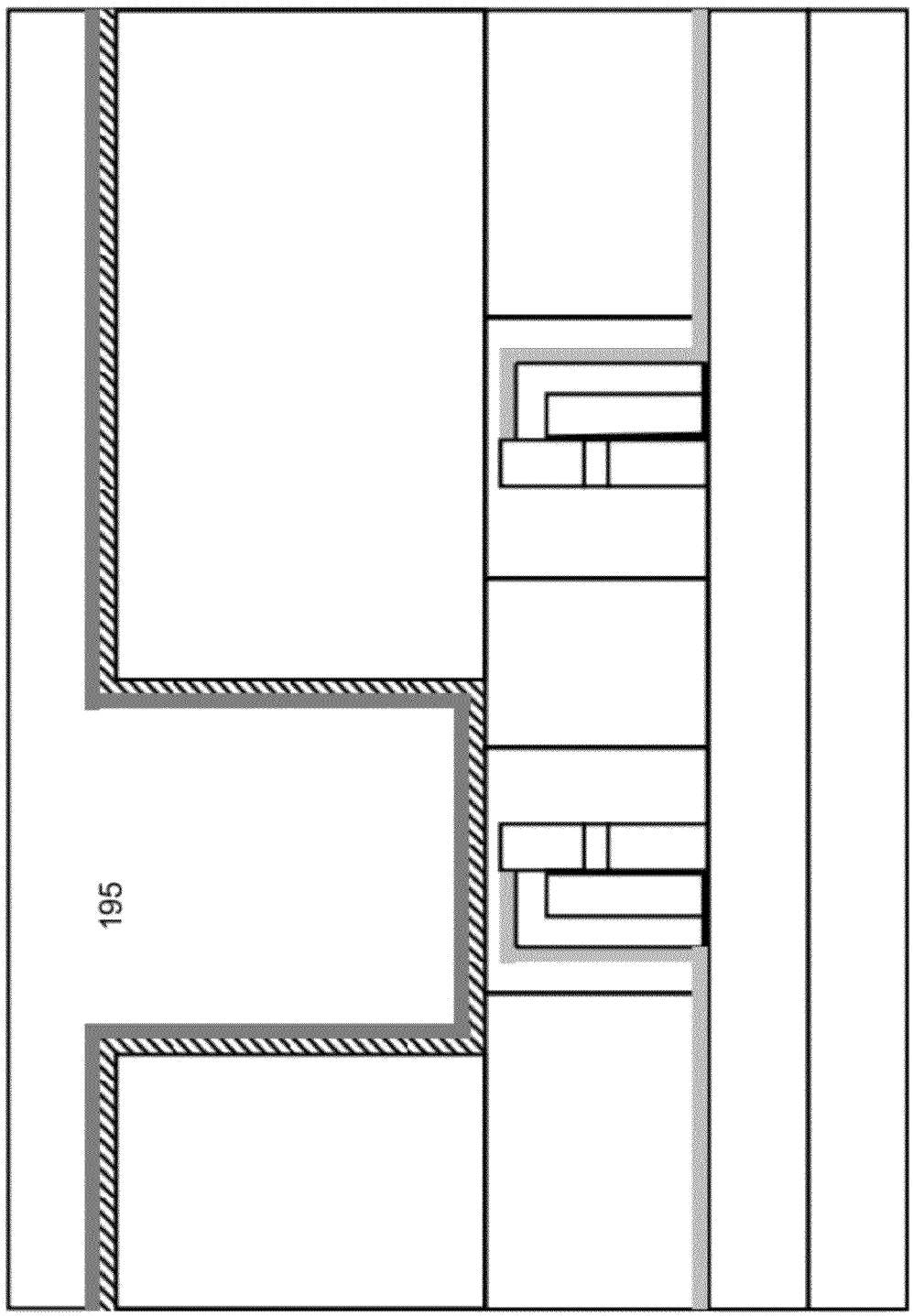
Figure 25:
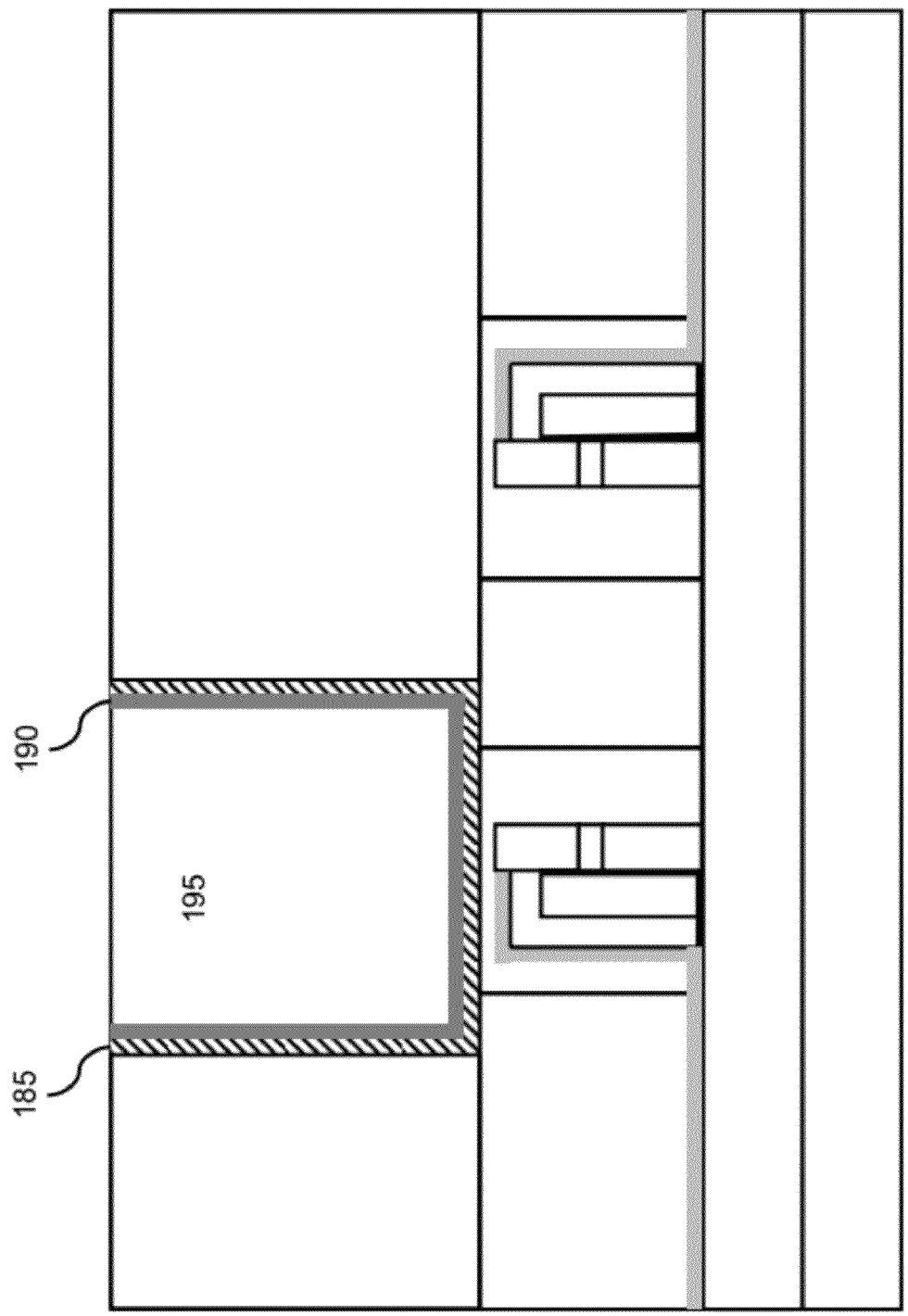

As depicted in FIG. 24, a trench conductor 195 is deposited on exposed surfaces. The trench conductor 195 may comprise, but is not limited to, a liner of titanium nitride or tantalum nitride with tungsten or doped polysilicon fill. Then, as shown in FIG. 25, the structure is planarized, e.g., using a CMP process, thereby removing portions of the conductive liner 185, the storage dielectric material 190, and the trench conductor 195.

Figure 26:
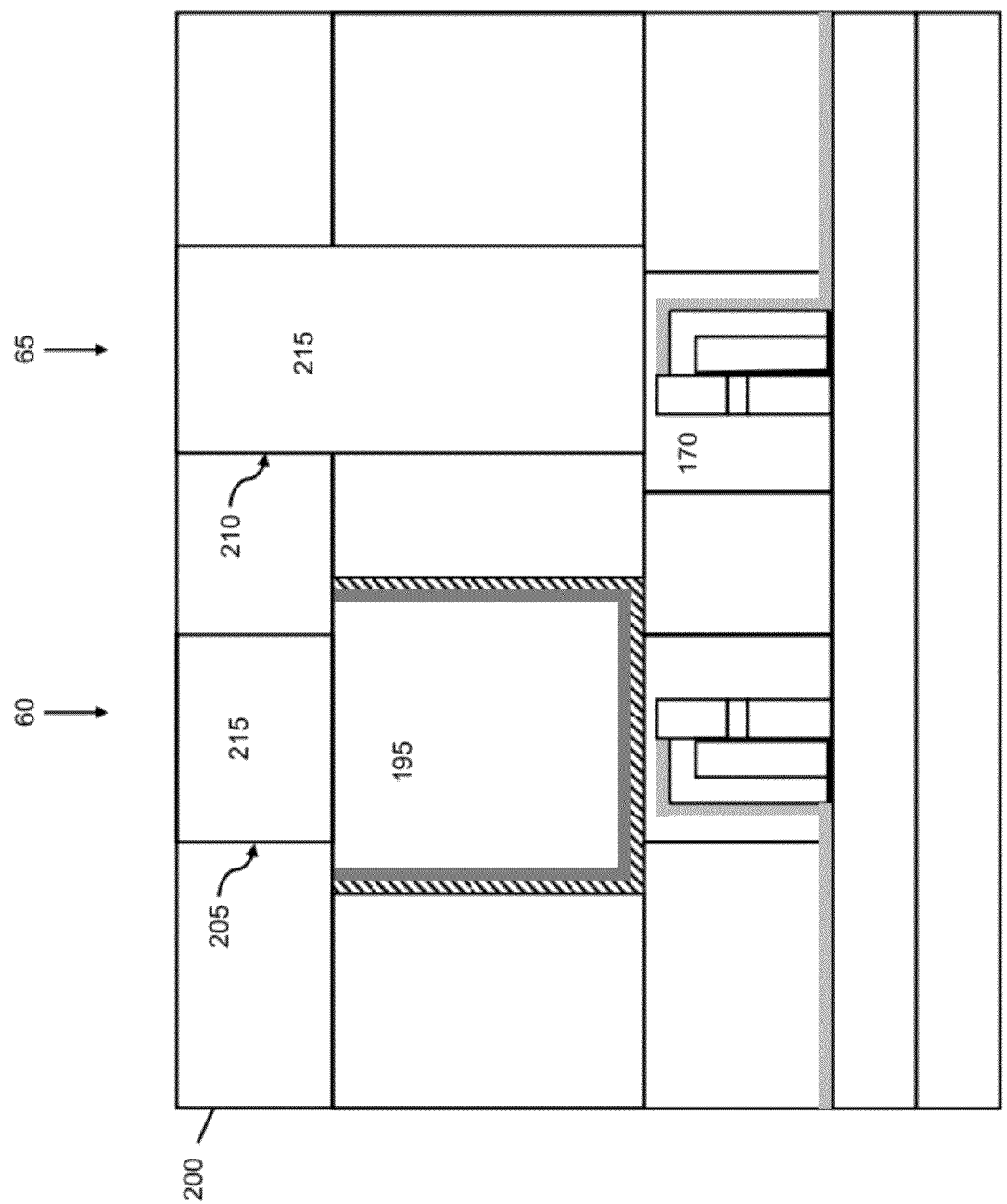

FIG. 26 shows a third dielectric layer 200 formed on a top surface of the second dielectric layer 175. Trenches 205 are formed through the third dielectric layer 200, down to the trench conductor 195. Trenches 210 are formed through the third dielectric layer 200 and the second dielectric layer 175, down to the conductor 170. The trenches 205 and 210 are filled with any suitable conductor 215, thereby forming interleaved capacitors 60 and bit line contacts 65 (e.g., as shown in FIG. 1). At this point, conventional back end of line (BEOL) processing techniques may be used to finish the array. For example, conventional interconnect processes may be used to providing wiring that completes the array. Although an array having four devices has been described thusfar, the invention is not limited to this number of devices, and any suitable number of devices can be used in an array in accordance with aspects of the invention.

Figure 27:
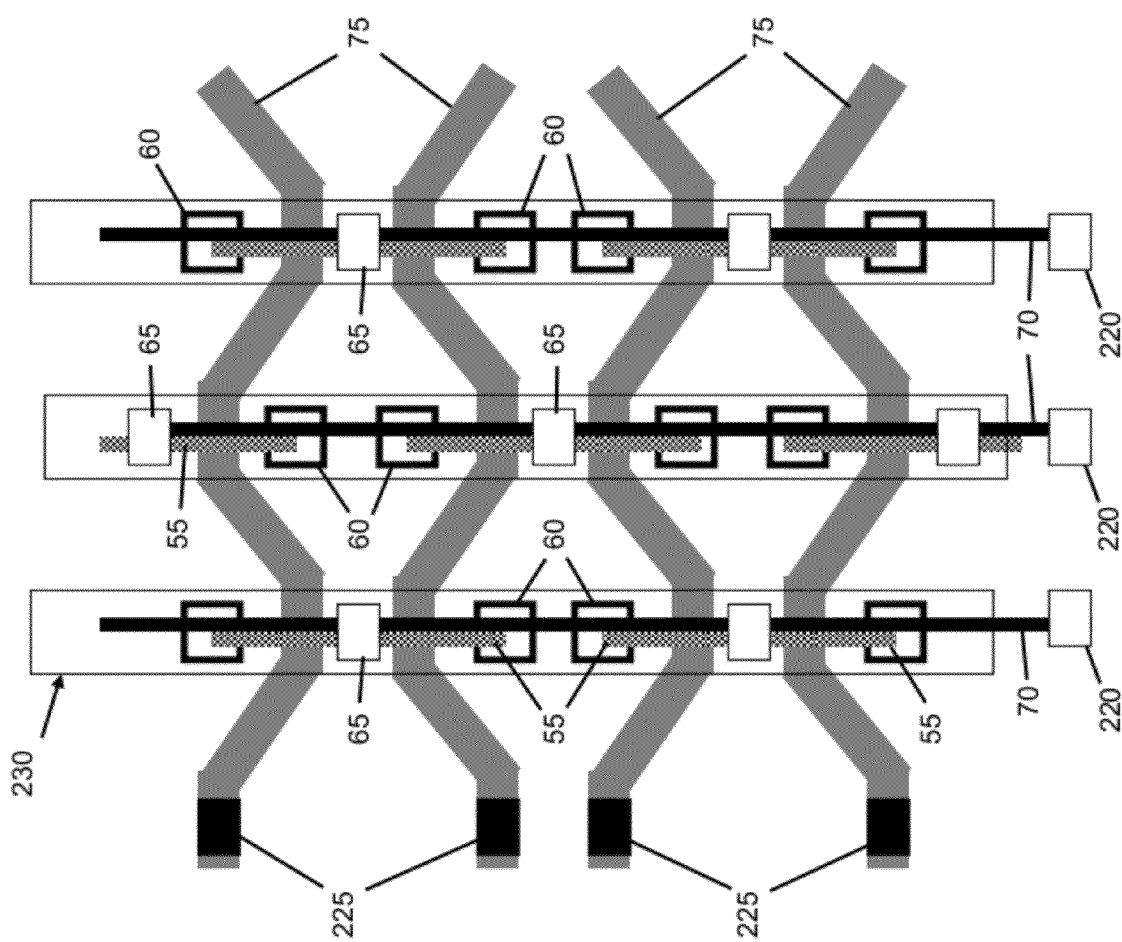
FIG. 27 shows a cross-sectional plan view of portions of another arrangement of an interleaved array of DRAM devices according to aspects of the invention.

FIG. 27 shows an alternative configuration of an interleaved array of DRAM devices according to aspects of the invention. The array includes fins 55, word lines 75, back-gates 70, bit line contacts 65, and storage capacitors 60, either formed downward from the fin 55 (e.g., as shown in FIG. 20) or formed upward from the fin 55 (e.g., as shown in FIG. 26). Back-gate contacts 220, word-line contacts 225, and wires 230 connected to the bit line contacts 65 may also be employed.

Design Structure

FIG. 28 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-27. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 28 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-27. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-27 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-27. In one embodiment, design structure 990 may comprise a compiled, executable HDL simulation model that functionally simulates the devices shown in FIGS. 1-27.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-27. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor structure of an array of dynamic random access memory cells, comprising:
    a first fin of a first split-gate fin-type field effect transistor (FinFET) device on a substrate;
    a second fin of a second split-gate fin-type field effect transistor (FinFET) device on the substrate; and
    a back-gate associated with the first fin and the second fin, wherein the back-gate influences a threshold voltage of the first fin and a threshold voltage of the second fin;
    the first split-gate fin-type field effect transistor (FinFET) device comprises the first fin and a first storage capacitor; and
    the second split-gate fin-type field effect transistor (FinFET) device comprises the second fin and a second storage capacitor.

2. The semiconductor structure of claim 1, wherein:
    the back gate is formed on a first lateral side of the first fin, and
    the back gate is formed on a first lateral side of the second fin.

3. The semiconductor structure of claim 2, further comprising:
    a first word line formed on a second lateral side of the first fin opposite the back gate; and
    a second word line formed on a second lateral side of the second fin opposite the back gate.

4. The semiconductor structure of claim 1, further comprising:
    the first storage capacitor formed at a first end of the first fin; and
    a bit line contact formed at a second end of the first fin opposite the first end of the first fin.

5. The semiconductor structure of claim 4, wherein the first storage capacitor is formed in a trench formed in the substrate.

6. The semiconductor structure of claim 4, wherein the first storage capacitor is formed in a trench formed above the fin.

7. The semiconductor structure of claim 1, wherein:
    the first storage capacitor is formed in a substrate below the first fin, and
    the second storage capacitor is formed in the substrate below the second fin.

8. The semiconductor structure of claim 1, wherein:
    the first storage capacitor is formed in a dielectric layer above the first fin, and
    the second storage capacitor is formed in the dielectric layer above the second fin.

9. The semiconductor structure of claim 1, wherein the array of dynamic random access memory cells is formed as an interleaved array.

10. The semiconductor structure of claim 1, wherein the first FinFET device and the second FinFET device are aligned.

11. The semiconductor structure of claim 1, further comprising:
    a third split-gate fin-type field effect transistor (FinFET) device comprising a third fin and a third storage capacitor;
    a fourth split-gate fin-type field effect transistor (FinFET) device comprising a fourth fin and a fourth storage capacitor; and
    a second back-gate associated with the third fin and the fourth fin,
    wherein the second back-gate influences a threshold voltage of the third fin and a threshold voltage of the fourth fin.

12. A design structure tangibly embodied in a machine readable medium for designing, manufacturing, or testing an integrated circuit, the design structure comprising:
    a first split-gate fin-type field effect transistor (FinFET) device comprising a first fin and a first storage capacitor;
    a second split-gate fin-type field effect transistor (FinFET) device comprising a second fin and a second storage capacitor; and
    a back-gate associated with the first fin and the second fin, wherein the back-gate influences a threshold voltage of the first fin and a threshold voltage of the second fin.

13. The design structure of claim 12, wherein the design structure comprises a netlist.

14. The design structure of claim 12, wherein the design structure resides on storage medium as a data format used for exchange of layout data of integrated circuits.

15. The design structure of claim 12, wherein the design structure resides in a programmable gate array.

16. A method of controlling an array of dynamic random access memory cells, comprising:
    arranging a back-gate in association with a first plurality of split-gate fin-type field effect transistor (FinFET) devices in the array; and selectively influencing a voltage in a fin of each of the plurality of FinFET devices between a first threshold voltage and a second threshold voltage using the back-gate, wherein each of the first plurality of split-gate fin-type field effect transistor (FinFET) devices comprises a dynamic random access (DRAM) memory cell having a storage capacitor.

17. The method of claim 16, wherein:
the first threshold voltage is a standby mode voltage, and the second threshold voltage is an access mode voltage.

18. The method of claim 17, wherein the back-gate controls all of the plurality of FinFET devices simultaneously.

19. The method of claim 16, further comprising:
arranging a second back-gate in association with a second plurality of split-gate fin-type field effect transistor (FinFET) devices in the array; and selectively influencing a voltage in a fin of each of the second plurality of FinFET devices between using the second back-gate.

20. The semiconductor structure of claim 1, wherein:
the first and second FinFET devices comprise respective dynamic random access (DRAM) memory cells;
the back gate selectively influences a voltage of the first fin and a voltage of the second fin between a first threshold voltage and a second threshold voltage; and
the back-gate controls the first and second FinFET devices simultaneously.

21. The design structure of claim 12, wherein:
the first and second FinFET devices comprise respective dynamic random access (DRAM) memory cells;
the back gate selectively influences a voltage of the first fin and a voltage of the second fin between a first threshold voltage and a second threshold voltage; and
the back-gate controls the first and second FinFET devices simultaneously.

\* \* \* \* \*